(12) United States Patent
Tachibana et al.

(10) Patent No.: US 10,996,280 B2
(45) Date of Patent: May 4, 2021

(54) BATTERY PACK THAT CALCULATES FULL CHARGE CAPACITY OF A BATTERY BASED ON A STATE OF CHARGE

(71) Applicant: DENSO CORPORATION, Kariya (JP)

(72) Inventors: Yuki Tachibana, Kariya (JP); Yamato Utsunomiya, Kariya (JP); Takeshi Sada, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/511,920

(22) Filed: Jul. 15, 2019

(65) Prior Publication Data
US 2019/0339332 A1 Nov. 7, 2019

Related U.S. Application Data

(63) Continuation of application No. PCT/JP2018/000496, filed on Jan. 11, 2018.

(30) Foreign Application Priority Data

Jan. 13, 2017 (JP) .............................. JP2017-003837

(51) Int. Cl.
*H02J 7/00* (2006.01)
*G01R 31/382* (2019.01)
(Continued)

(52) U.S. Cl.
CPC ............ *G01R 31/382* (2019.01); *B60L 58/12* (2019.02); *H01M 10/44* (2013.01); *H01M 10/48* (2013.01);
(Continued)

(58) Field of Classification Search
CPC .... G01R 31/382; H02J 7/0048; H02J 7/0049; H02J 7/005; H02J 7/0047; H02J 7/0021;
(Continued)

(56) References Cited

U.S. PATENT DOCUMENTS

| 4,525,662 | A | * | 6/1985 | Kato | ...................... | H02J 7/2434 |
| | | | | | | 322/28 |
| 4,665,354 | A | * | 5/1987 | Sada | ......................... | H02J 7/24 |
| | | | | | | 320/123 |

(Continued)

FOREIGN PATENT DOCUMENTS

| JP | 2003-134678 A | | 5/2003 |
| JP | 2004251744 A | * | 9/2004 |
| JP | 2015-170138 A | | 9/2015 |

OTHER PUBLICATIONS

Apr. 10, 2018 Search Report issued in International Application No. PCT/JP2018/000496.

*Primary Examiner* — John T Trischler (74) *Attorney, Agent, or Firm* — Oliff PLC (57) ABSTRACT

A battery pack includes a secondary battery, a state of charge calculator, an integrated current amount calculator, a differential state of charge calculator, a full charge capacity calculator, and a charging-and-discharging control section. The differential state of charge calculator calculates a differential state of charge between a first state of charge at a first detection timing and a second state of charge at a second detection timing. The integrated current amount calculator calculates an integrated amount of a current flowing to the secondary battery in a subject period from the first detection timing to the second detection timing. The full charge capacity calculator calculates a full charge capacity of the secondary battery based on the differential state of charge and the integrated current amount. The charging-and-discharging control section is configured to restrict one of the charging and the discharging of the secondary battery during the subject period.

8 Claims, 6 Drawing Sheets

(51) Int. Cl.
*B60L 58/12* (2019.01)
*H01M 10/44* (2006.01)
*H01M 10/48* (2006.01)

(52) U.S. Cl.
CPC ............ *H02J 7/005* (2020.01); *H02J 7/0021* (2013.01); *H02J 7/0047* (2013.01); *H02J 7/0048* (2020.01); *H02J 7/0049* (2020.01); *B60L 2240/547* (2013.01); *B60L 2240/549* (2013.01)

(58) Field of Classification Search
CPC .. H02J 7/1423; H01M 10/441; H01M 10/482; H01M 10/425; H01M 2/1077; H01M 10/44; H01M 10/48; B60L 58/13; B60L 58/14; B60L 58/15; B60L 58/12
USPC .......................................................... 320/132
See application file for complete search history.

(56) References Cited

U.S. PATENT DOCUMENTS

| | | | | |
|---|---|---|---|---|
| 5,280,231 A * | 1/1994 | Kato | G01R 31/3842 | 322/28 |
| 5,672,973 A * | 9/1997 | Arai | G01R 31/3842 | 324/427 |
| 6,133,715 A * | 10/2000 | Sada | H02P 9/305 | 322/28 |
| 6,495,989 B1 * | 12/2002 | Eguchi | H02J 7/00 | 320/132 |
| 6,563,318 B2 * | 5/2003 | Kawakami | G01R 31/389 | 324/426 |
| 6,583,606 B2 * | 6/2003 | Koike | H02J 7/0069 | 320/149 |
| 6,608,482 B2 * | 8/2003 | Sakai | B60K 6/445 | 324/426 |
| 6,639,385 B2 * | 10/2003 | Verbrugge | G01R 31/3835 | 320/132 |
| 7,085,661 B2 * | 8/2006 | Emori | B60W 10/26 | 702/63 |
| 7,233,128 B2 * | 6/2007 | Brost | G01R 31/3648 | 320/132 |
| 7,317,300 B2 * | 1/2008 | Sada | G01R 31/379 | 320/136 |
| 7,352,156 B2 * | 4/2008 | Ashizawa | G01R 31/367 | 320/132 |
| 7,406,389 B2 * | 7/2008 | Emori | B60W 10/26 | 702/85 |
| 7,507,497 B2 * | 3/2009 | Yamashita | G01R 31/379 | 429/50 |
| 7,554,297 B2 * | 6/2009 | Sada | G01R 31/379 | 320/132 |
| 7,630,842 B2 * | 12/2009 | Murakami | G01R 31/367 | 702/64 |
| 7,679,328 B2 * | 3/2010 | Mizuno | G01R 31/3828 | 320/132 |
| 8,078,416 B2 * | 12/2011 | Iwane | G01R 31/367 | 702/63 |
| 8,084,996 B2 * | 12/2011 | Zhang | G01R 31/392 | 320/132 |
| 8,274,291 B2 * | 9/2012 | Tsuchiya | G01R 31/367 | 324/426 |
| 8,340,932 B2 * | 12/2012 | Ichikawa | G01R 31/3828 | 702/63 |
| 8,374,807 B2 * | 2/2013 | Hall | G01R 31/367 | 702/63 |
| 8,436,585 B2 * | 5/2013 | Yano | B60L 58/13 | 320/132 |
| 8,510,007 B2 * | 8/2013 | Mori | B60K 6/48 | 701/69 |
| 8,645,088 B2 * | 2/2014 | Schaefer | H01M 10/4257 | 702/63 |
| 8,664,960 B2 * | 3/2014 | Tsuchiya | G01R 31/367 | 324/426 |
| 8,788,225 B2 * | 7/2014 | Wood | G01R 31/3835 | 702/63 |
| 8,823,325 B2 * | 9/2014 | Ling | G01R 31/3835 | 320/132 |
| 8,912,761 B2 * | 12/2014 | Izumi | B60L 11/1862 | 320/148 |
| 8,918,300 B2 * | 12/2014 | Baba | G01R 31/3648 | 702/63 |
| 9,013,151 B2 * | 4/2015 | Tabuchi | G01R 31/3648 | 320/132 |
| 9,037,426 B2 * | 5/2015 | Schaefer | G01R 31/3842 | 702/63 |
| 9,291,679 B2 * | 3/2016 | Yamada | G01R 31/3828 | |
| 9,329,240 B2 * | 5/2016 | Baba | B60L 58/12 | |
| 9,365,129 B2 * | 6/2016 | Kikuchi | B60L 3/12 | |
| 9,428,177 B2 * | 8/2016 | Mori | B60L 58/13 | |
| 9,572,500 B2 * | 2/2017 | Doi | A61B 5/02225 | |
| 9,643,508 B2 * | 5/2017 | Boehm | B60L 11/1861 | |
| 9,709,633 B2 * | 7/2017 | Arizono | H01M 10/48 | |
| 10,147,983 B2 * | 12/2018 | Kawahara | B60K 6/28 | |
| 10,274,545 B2 * | 4/2019 | Sugiyama | G01R 31/367 | |
| 10,322,634 B2 * | 6/2019 | Wang | H01M 10/48 | |
| 10,386,418 B2 * | 8/2019 | Takegami | G01R 31/3842 | |
| 10,444,296 B2 * | 10/2019 | Miyamoto | G01R 31/3842 | |
| 10,449,870 B2 * | 10/2019 | Chang | B60L 58/13 | |
| 10,566,815 B2 * | 2/2020 | Fujita | H02J 7/00041 | |
| 10,644,359 B2 * | 5/2020 | Fujita | H02J 7/00 | |
| 10,656,210 B2 * | 5/2020 | Takashima | G01R 31/388 | |
| 2002/0014879 A1 * | 2/2002 | Koike | H02J 7/0069 | 320/133 |
| 2002/0167294 A1 * | 11/2002 | Odaohhara | H02J 7/0031 | 320/132 |
| 2003/0076109 A1 * | 4/2003 | Verbrugge | G01R 31/392 | 324/427 |
| 2003/0195719 A1 * | 10/2003 | Emori | B60W 20/13 | 702/183 |
| 2004/0257045 A1 * | 12/2004 | Sada | G01R 31/3648 | 320/132 |
| 2005/0119856 A1 * | 6/2005 | Emori | B60W 20/13 | 702/127 |
| 2006/0022643 A1 * | 2/2006 | Brost | G01R 31/367 | 320/132 |
| 2006/0028179 A1 * | 2/2006 | Yudahira | G01R 19/16542 | 320/133 |
| 2006/0247871 A1 * | 11/2006 | Emori | B60L 58/12 | 702/57 |
| 2006/0276980 A1 * | 12/2006 | Mizuno | G01R 31/3648 | 702/63 |
| 2007/0029973 A1 * | 2/2007 | Ashizawa | G01R 31/3828 | 320/132 |
| 2007/0054177 A1 * | 3/2007 | Yamashita | G01R 31/379 | 429/50 |
| 2007/0090805 A1 * | 4/2007 | Mizuno | G01R 31/3828 | 320/132 |
| 2007/0145948 A1 * | 6/2007 | Lim | B60W 10/26 | 320/132 |
| 2007/0257641 A1 * | 11/2007 | Sada | G01R 31/3648 | 320/132 |
| 2008/0162059 A1 * | 7/2008 | Murakami | G01R 31/367 | 702/63 |
| 2009/0001992 A1 * | 1/2009 | Tsuchiya | G01R 31/374 | 324/426 |
| 2009/0157246 A1 * | 6/2009 | Mori | B60K 6/48 | 701/22 |
| 2009/0322283 A1 * | 12/2009 | Zhang | G01R 31/3842 | 320/134 |
| 2010/0026243 A1 * | 2/2010 | Tatsumi | H02J 7/1446 | 320/132 |
| 2010/0131217 A1 * | 5/2010 | Ichikawa | G01R 31/3828 | 702/63 |
| 2010/0156356 A1 * | 6/2010 | Asakura | H01M 10/46 | 320/148 |
| 2010/0244886 A1 * | 9/2010 | Kawahara | G01R 31/3828 | 324/764.01 |
| 2011/0089905 A1 * | 4/2011 | Yano | H01M 10/486 | 320/132 |

(56) References Cited

U.S. PATENT DOCUMENTS

| | | | |
|---|---|---|---|
| 2011/0127962 A1* | 6/2011 | Murao | H02J 7/0016 320/118 |
| 2011/0152700 A1 | 6/2011 | Sawanoi et al. | |
| 2011/0172940 A1* | 7/2011 | Wood | G01R 31/3835 702/63 |
| 2011/0199115 A1* | 8/2011 | Iida | B60L 3/0046 324/764.01 |
| 2011/0257914 A1* | 10/2011 | Tsuchiya | G01R 31/367 702/63 |
| 2012/0016547 A1* | 1/2012 | Aridome | B60L 50/16 701/22 |
| 2012/0091969 A1* | 4/2012 | Izumi | B60L 11/1862 320/148 |
| 2012/0226170 A1* | 9/2012 | Doi | A61B 5/022 600/490 |
| 2012/0306450 A1* | 12/2012 | Nakayama | G01R 31/367 320/134 |
| 2012/0326726 A1* | 12/2012 | Tabuchi | G01R 31/3648 324/434 |
| 2013/0076366 A1* | 3/2013 | Arizono | G01R 31/382 324/435 |
| 2013/0187611 A1* | 7/2013 | Suzuki | H02J 7/0018 320/118 |
| 2013/0297243 A1* | 11/2013 | Baba | B60L 58/12 702/63 |
| 2014/0167656 A1* | 6/2014 | Yamada | G01R 31/3842 318/139 |
| 2014/0225622 A1* | 8/2014 | Kudo | B60L 53/14 324/433 |
| 2014/0257726 A1* | 9/2014 | Baba | G01R 31/3648 702/63 |
| 2014/0368208 A1* | 12/2014 | Yamada | H01M 10/48 324/433 |
| 2015/0066344 A1 | 3/2015 | Kikuchi et al. | |
| 2015/0070024 A1* | 3/2015 | Kim | H01M 10/48 324/430 |
| 2015/0127280 A1* | 5/2015 | Baba | G01R 31/3842 702/63 |
| 2015/0177331 A1* | 6/2015 | Nakayama | G01R 31/3828 702/63 |
| 2015/0268306 A1* | 9/2015 | Sugiyama | G01R 31/367 702/63 |
| 2016/0001766 A1* | 1/2016 | Mori | B60L 7/16 701/22 |
| 2016/0276843 A1* | 9/2016 | Chang | H01M 10/44 |
| 2016/0351976 A1* | 12/2016 | Kawahara | G01R 31/3828 |
| 2017/0005488 A1* | 1/2017 | Suzuki | G01R 31/367 |
| 2017/0106760 A1* | 4/2017 | Wang | B60L 53/53 |
| 2017/0237091 A1* | 8/2017 | Zhang | H01M 8/188 429/91 |
| 2017/0254857 A1* | 9/2017 | Miyamoto | G01R 31/388 |
| 2017/0269165 A1* | 9/2017 | Takashima | H02J 7/00 |
| 2017/0341520 A1* | 11/2017 | Chang | B60L 58/15 |
| 2018/0006335 A1* | 1/2018 | Fujita | H01M 10/425 |
| 2018/0017628 A1* | 1/2018 | Takegami | G01R 31/3648 |
| 2018/0024200 A1* | 1/2018 | Hiwa | G01R 31/3842 702/63 |
| 2018/0037130 A1* | 2/2018 | Ohkawa | H01M 10/48 |
| 2018/0076633 A1* | 3/2018 | Fujita | H02J 7/0047 |
| 2018/0261893 A1* | 9/2018 | Fujita | H02J 7/0031 |
| 2018/0267108 A1* | 9/2018 | Morita | H01M 10/441 |
| 2018/0292462 A1* | 10/2018 | Itabashi | H01M 10/425 |
| 2018/0313906 A1* | 11/2018 | Takahashi | G01R 31/382 |
| 2019/0252908 A1* | 8/2019 | Takita | B60R 16/02 |
| 2019/0317149 A1* | 10/2019 | Tachibana | H01M 10/482 |
| 2019/0334371 A1* | 10/2019 | Watanabe | H02J 7/18 |

* cited by examiner

BATTERY PACK THAT CALCULATES FULL CHARGE CAPACITY OF A BATTERY BASED ON A STATE OF CHARGE

CROSS-REFERENCE TO RELATED APPLICATION

The present application is based on Japanese Patent Application No. 2017-3837 filed on Jan. 13, 2017, the description of which is incorporated herein by reference.

BACKGROUND

Technical Field

The present disclosure relates to a battery pack and a power supply system.

Related Art

Conventionally, a method for calculating the full charge capacity of a secondary battery included in a battery pack is known. The method uses a relational expression between a difference $\Delta SOC$ between a $SOC1$, which is the state of charge of the secondary battery at first detection timing, and a $SOC2$, which is the state of charge at subsequent second timing, and an integrated current amount $\int I dt$ of the secondary battery from the first detection timing to the second detection timing.

SUMMARY

As an aspect of the present disclosure, a battery pack is provided which includes: a secondary battery; a voltage detector that detects a terminal voltage of the secondary battery; a state of charge calculator that calculates a state of charge of the secondary battery based on the terminal voltage detected by the voltage detector; a current detector that detects a current flowing to the secondary battery; a charging-and-discharging control section that controls charging and discharging of the secondary battery; a differential state of charge calculator that calculates a differential state of charge between a first state of charge calculated based on a first terminal voltage detected by the voltage detector at a first detection timing and a second state of charge calculated based on a second terminal voltage detected by the voltage detector at a second detection timing; an integrated current amount calculator that calculates an integrated amount of the current detected by the current detector in a subject period from the first detection timing to the second detection timing; and a full charge capacity calculator that calculates a full charge capacity of the secondary battery based on the differential state of charge calculated by the differential state of charge calculator and the integrated current amount calculated by the integrated current amount calculator. The charging-and-discharging control section is configured to restrict one of charging and discharging of the secondary battery during the subject period, a timing at which the differential state of charge becomes more than or equal to a predetermined required differential state of charge is set as the second detection timing, and the charging-and-discharging control section is configured to determine which one of the charging and the discharging to restrict based on the first state of charge and the required differential state of charge.

DETAILED DESCRIPTION OF THE PREFERRED EMBODIMENTS

Conventionally, a method for calculating the full charge capacity of a secondary battery included in a battery pack is known. The method uses a relational expression between a difference $\Delta SOC$ between a $SOC1$, which is the state of charge of the secondary battery at first detection timing, and a $SOC2$, which is the state of charge at subsequent second timing, and an integrated current amount $\int I dt$ of the secondary battery from the first detection timing to the second detection timing. For example, Japanese Laid-Open Patent Publication No. 2003-134678 discloses a configuration of a control device of a secondary battery mounted in a vehicle. In the configuration disclosed in Japanese Laid-Open Patent Publication No. 2003-134678, during a trip period from when ignition of the vehicle is turned on to when the ignition is turned off, by causing a difference in the center of control of the SOC between a first trip and a second trip, a $\Delta SOC$ of approximately 10% is calculated before and after the second trip, and the full charge capacity of the secondary battery is calculated from $\Delta SOC$ and the integrated current amount $\int I dt$.

In the configuration disclosed in Japanese Laid-Open Patent Publication No. 2003-134678, a current sensor used for calculating the integrated current amount $\int I dt$ has an offset error. The configuration disclosed in Japanese Laid-Open Patent Publication No. 2003-134678 both charges and discharges the secondary battery during the trip period, which is the subject of measurement. Thus, the period of time during which the current sensor measures a current value is increased, so that the offset errors of the current sensor are accumulated in the integrated current amount. As a result, since the error included in the integrated current amount is great, there is more room for improvement in calculating the full charge capacity accurately.

The present disclosure provides a battery pack that includes a secondary battery and can accurately calculate the full charge capacity of the secondary battery.

First Embodiment

The battery pack according to an embodiment will be described with reference to FIGS. 1 to 5.

Figure 1:
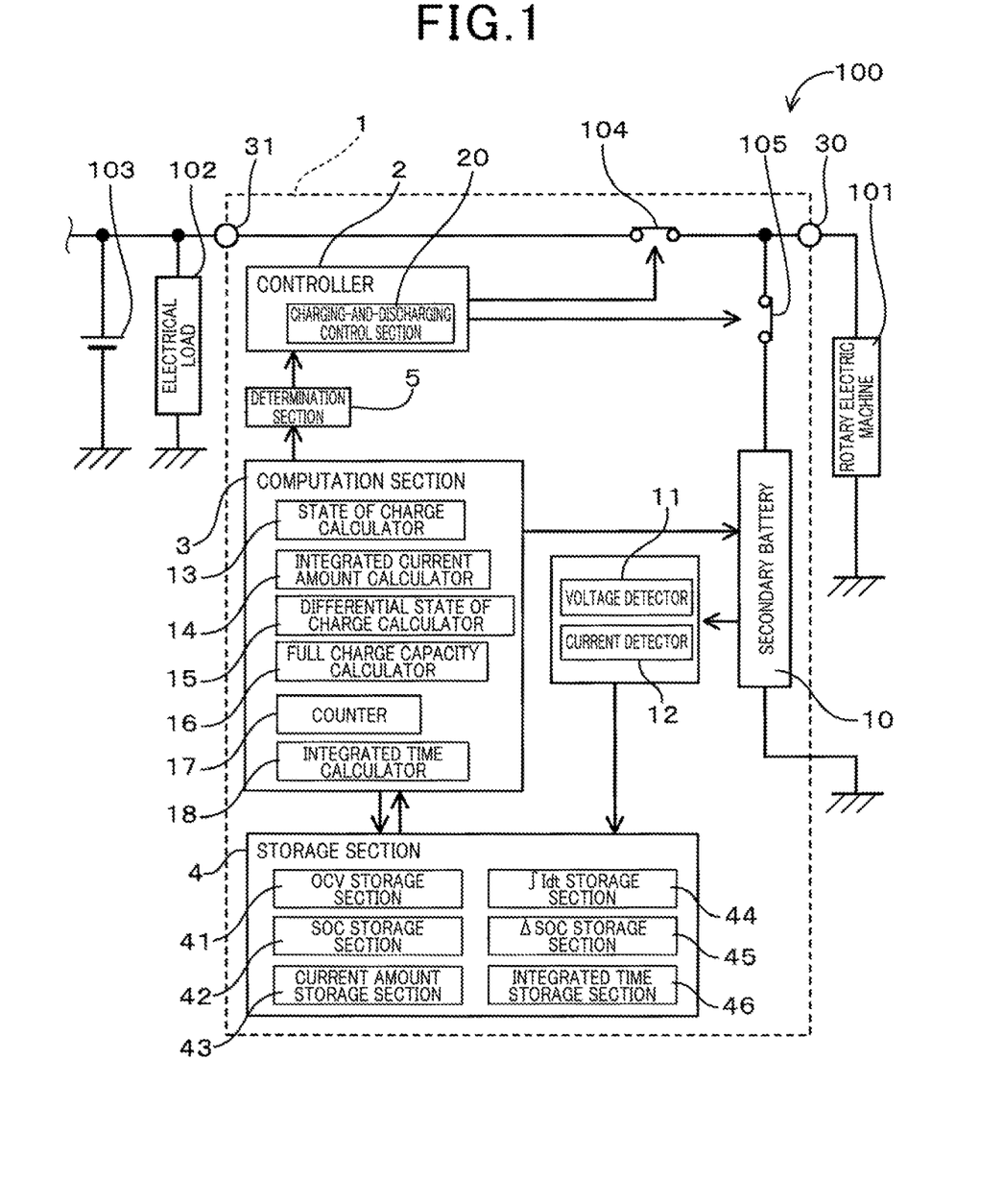
FIG. 1 is a block diagram illustrating a configuration of a battery pack and a power supply system according to a first embodiment.

A battery pack 1 according to the present embodiment includes, as shown in FIG. 1, a secondary battery 10, a voltage detector 11, a current detector 12, a state of charge calculator 13, an integrated current amount calculator 14, a differential state of charge calculator 15, a full charge capacity calculator 16, and a charging-and-discharging control section 20.

The voltage detector 11 detects a terminal voltage of the secondary battery 10.

The state of charge calculator 13 calculates a state of charge SOC based on the terminal voltage of the secondary battery 10.

The current detector 12 detects a current flowing to the secondary battery 10.

The charging-and-discharging control section 20 controls charging and discharging of the secondary battery 10.

The differential state of charge calculator 15 calculates a differential state of charge $\Delta SOC$ between a first state of charge SOC1 calculated based on a first terminal voltage OCV1 detected by the voltage detector 11 at a first detection timing t2 and a second state of charge SOC2 calculated based on a second terminal voltage OCV2 detected by the voltage detector 11 at a second detection timing t7.

The integrated current amount calculator 14 calculates an integrated amount $\int I dt$ of the current detected by the current detector 12 during a subject period T from the first detection timing t2 to the second detection timing t7.

The full charge capacity calculator 16 calculates the full charge capacity of the secondary battery 10 based on the differential state of charge $\Delta SOC$ calculated by the differential state of charge calculator 15 and the integrated current amount $\int I dt$ calculated by the integrated current amount calculator 14.

The charging-and-discharging control section 20 is configured to restrict one of charging and discharging of the secondary battery 10 during the subject period t2 to t7.

Hereinafter, the battery pack 1 according to the present embodiment will be described in detail.

In the present embodiment, the battery pack 1 is mounted in a vehicle. As shown in FIG. 1, a rotary electric machine 101 of the vehicle is connected to the battery pack 1 through a pack terminal 30 provided to the battery pack 1. An electrical load 102 and a Pb battery 103 are connected to the battery pack 1 through a pack terminal 31. These configure a power supply system 100.

As shown in FIG. 1, the secondary battery 10 of the battery pack 1 is connected to the pack terminals 30 and 31 through switches 104 and 105. Switching on and off the charging-and-discharging restriction switch 104 and the charging-and-discharging prohibition switch 105 is controlled by the charging-and-discharging control section 20 in a controller 2 of the battery pack 1. The kind of the secondary battery 10 is not limited, but for example, a nonaqueous secondary battery may be used. In the present embodiment, a lithium-ion battery is employed as the secondary battery 10.

As shown in FIG. 1, the voltage detector 11 is connected to the secondary battery 10. A known voltage sensor may be used as the voltage detector 11. The voltage detector 11 can detect a terminal voltage OCV, that is, an open circuit voltage of the secondary battery 10 at a predetermined detection timing. The terminal voltage detected by the voltage detector 11 is stored in an OCV storage section 41 of a storage section 4 in the battery pack 1.

The state of charge calculator 13 provided in a computation section 3 of the battery pack 1 calculates a state of charge SOC of the secondary battery 10 at a predetermined detection timing based on the terminal voltage at the predetermined detection timing stored in the OCV storage section 41. The state of charge calculator 13 previously stores an OCV-SOC conversion means that is based on the correspondence between the terminal voltage OCV and the state of charge SOC of the secondary battery 10. The state of charge calculator 13 can calculate a SOC at a predetermined detection timing from an OCV at the predetermined detection timing based on the OCV-SOC conversion means. The SOC calculated by the state of charge calculator 13 is stored in a SOC storage section 42 of the storage section 4.

As shown in FIG. 1, the current detector 12 is connected to the secondary battery 10. A known current sensor may be used as the current detector 12. The current detector 12 can detect a current I flowing to the secondary battery 10 during a predetermined time period. The current I detected by the current detector 12 is stored in a current amount storage section 43 of the storage section 4.

The integrated current amount calculator 14 included in the computation section 3 of the battery pack 1 can calculate the integrated current amount $\int I dt$ that has flowed to the secondary battery 10 during a predetermined time period based on the current I that has flowed during the predetermined time period stored in the current storage section. The integrated current amount $\int I dt$ calculated by the integrated current amount calculator 14 is stored in an $\int I dt$ storage section 44 of the storage section 4.

As shown in FIG. 1, the computation section 3 of the battery pack 1 includes the differential state of charge calculator 15. The differential state of charge calculator 15 calculates the differential state of charge $\Delta SOC$, which is the difference between the SOC1 at the first detection timing and the SOC2 at the second detection timing stored in the SOC storage section 42. The calculated $\Delta SOC$ is stored in a $\Delta SOC$ storage section 45 of the storage section 4.

The full charge capacity calculator 16 of the computation section 3 reads $\int I dt$ during the predetermined time period stored in the $\int I dt$ storage section 44 and $\Delta SOC$ during the predetermined time period stored in $\Delta SOC$ storage section 45 and calculates the full charge capacity from these values. The full charge capacity calculator 16 calculates the full charge capacity by using the following expression 1, which is a relational expression of the full charge capacity with respect to $\int I dt$ and $\Delta SOC$.

$$\text{Full charge capacity} = (\int I dt / \Delta SOC) \times 100 \qquad \text{(Expression 1)}$$

The present embodiment further includes, as shown in FIG. 1, a counter 17, which measures a time period during which current has flowed to the secondary battery 10, an integrated time calculator 18, which calculates an integrated time that is the subject of calculation by the integrated current amount calculator 14, and an integrated time storage section 46, which stores the calculation result of the integrated time calculator 18. The battery pack 1 includes a determination section 5, which makes a determination as described below based on the above-described calculated values.

As shown in FIG. 1, the battery pack 1 includes the charging-and-discharging control section 20 in the controller 2. The charging-and-discharging control section 20 can restrict one of charging and discharging of the secondary battery 10 during a later-described subject period. In the present embodiment, as described above, the charging-and-discharging control section 20 performs the above-described restriction by turning on and off the switches 104 and 105 and permitting and restricting generation of regenerative energy in the rotary electric machine 101. More specifically, to restrict the discharging of the secondary battery 10, the charging-and-discharging prohibition switch 105, which will be discussed below, is turned on, and the charging-and-discharging restriction switch 104 is turned off so as to interrupt electric power supply to the electrical load 102 and the Pb battery 103 and permit generation of the regenerative energy by the rotary electric machine 101. Thus, the regenerative energy output from the rotary electric machine 101 is input to the secondary battery 10 to charge the secondary battery 10. To restrict charging of the secondary battery 10, the generation of the regenerative energy by the rotary electric machine 101 is restricted, and the charging-and-discharging prohibition switch 105 and the charging-and-discharging restriction switch 104 are turned on so as to allow the electric power supply to the electrical load 102, the Pb battery 103, and the rotary electric machine 101. Thus, charging of the secondary battery 10 is restricted.

In the present embodiment, as shown in FIG. 1, the charging-and-discharging control section 20 can control turning on and off of the charging-and-discharging prohibition switch 105, which is connected to the secondary battery 10. Thus, the charging-and-discharging control section 20 can simultaneously prohibit both charging and discharging of the secondary battery 10.

Next, control for calculating the full charge capacity of the secondary battery 10 in the battery pack 1 will be described with reference to FIGS. 2 and 3.

Figure 2:
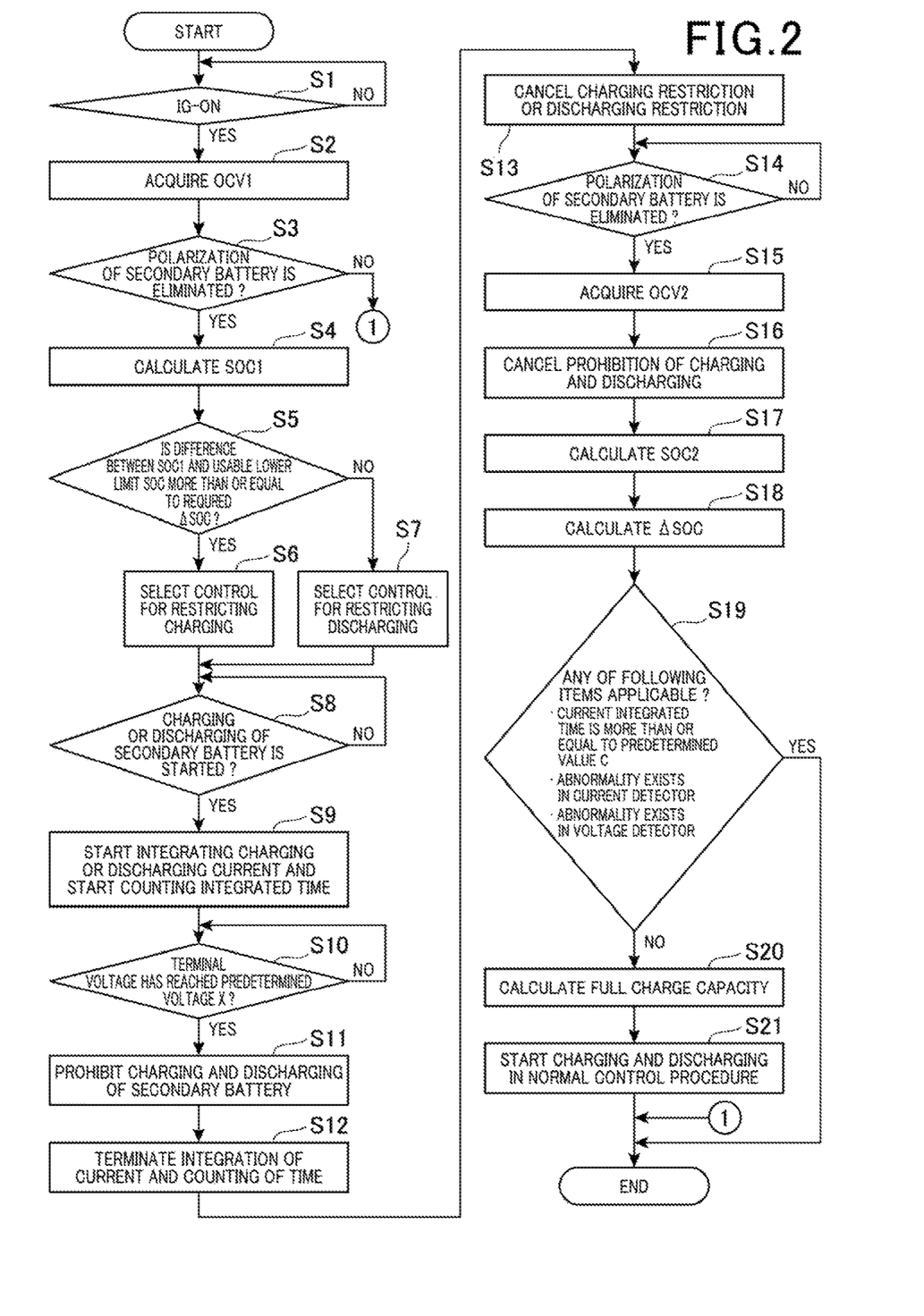
FIG. 2 is a control flowchart of the battery pack according to the first embodiment.

As shown in FIG. 2, first in step S1, an ignition IG of the vehicle is turned on. As shown in FIG. 3(a), the timing at which the IG is turned on is t1. Subsequently, when the first detection timing t2 arrives, in step S2 shown in FIG. 2, the first terminal voltage OCV1 of the secondary battery 10 is acquired by the voltage detector 11.

Next, in step S3 shown in FIG. 2, it is determined whether polarization of the secondary battery 10 has been eliminated. In the present embodiment, if an hour or more has elapsed from when the secondary battery 10 was previously used, it is determined that the polarization of the secondary battery 10 has been eliminated. The elapsed time may be measured using a non-illustrated counter provided in the vehicle. The polarization may be forcibly eliminated by, for example, applying electric power to the secondary battery 10.

If it is determined in step S3 that the polarization has not been eliminated, the control is terminated. If it is determined in step S3 that the polarization has been eliminated, in step S4 shown in FIG. 2, the state of charge calculator 13 calculates the first state of charge SOC1 based on the OCV1. The timing at which the SOC1 is calculated is t3 shown in FIG. 2. Step S3 may be executed before step S2, and step S4 may be executed after step S2.

Subsequently, in step S5 shown in FIG. 2, it is determined whether the absolute value of the difference between the SOC1 and a usable lower limit SOC is more than or equal to a required differential state of charge, that is, a required ΔSOC. The required ΔSOC defines the level required for reducing a calculation error as ΔSOC used for calculating the full charge capacity and can be previously and appropriately set in accordance with, for example, the type of the secondary battery 10, the configuration of the power supply system 100, and the environment in which the battery pack 1 is used. In step S5, if it is determined that the absolute value of the difference between the SOC1 and the usable lower limit SOC is more than or equal to the required ΔSOC, in step S6, the charging-and-discharging control section 20 selects performing control for restricting charging. At a timing t4 shown in FIG. 3(c), charging restriction of charging and discharging restriction control is turned on. This permits only discharging of the secondary battery 10. In the state in which the charging restriction is turned on, a state in which discharging is not performed is also permitted. That is, as shown in FIG. 4, at and after t5 in which the charging restriction is turned on, there may be a state in which discharging does not occur, so that the SOC is not decreased and remains almost unchanged.

Figure 5:
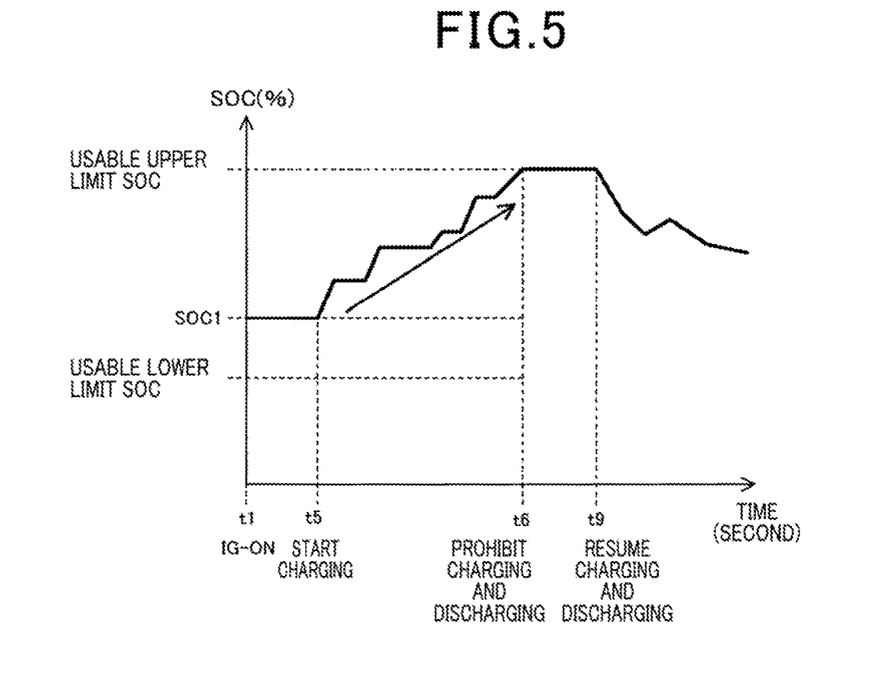
FIG. 5 is a graph showing a change in SOC in a state in which discharging is restricted according to the first embodiment.

In step S5 in FIG. 2, if it is determined that the absolute value of the difference between the SOC1 and the usable lower limit SOC is not more than or equal to the required ΔSOC, in step S7, the charging-and-discharging control section 20 selects performing control for restricting discharging and turns on the discharging restriction of the charging and discharging restriction control. This permits only the charging of the secondary battery 10. In the state in which the discharging restriction is turned on, a state in which charging is not performed is also permitted. That is, as shown in FIG. 5, at and after t5 in which the discharging restriction is turned on, there may be a state in which charging does not occur, so that the SOC is not increased and remains almost unchanged.

Subsequently, in step S8, it is determined whether charging of the secondary battery 10 is started. In the present embodiment, it is determined whether the regenerative energy generated by the rotary electric machine 101 is applied to the secondary battery 10. In step S8, if it is determined that charging of the secondary battery 10 is started, that is, if the current detector 12 detects current flowing to the secondary battery 10 at t5 as shown in FIG. 3(d), the integrated current amount calculator 14 starts integrating the current amount and starts the counter 17 in step S9 shown in FIG. 2. FIG. 3(d) shows the current when charging is restricted, and the timing at which the current has started to be detected is referred to as t5. As shown in FIG. 3(e), the integration of the current amount and the counter are started at t5.

In step S10 shown in FIG. 2, it is determined whether the terminal voltage of the secondary battery 10 has reached a predetermined termination voltage X. The termination voltage X may be set appropriately. However, in the present embodiment, the termination voltage X is set to an OCV corresponding to the usable lower limit SOC or a usable upper limit SOC obtained by the OCV-SOC conversion means based on the usable lower limit SOC or the usable upper limit SOC. When the charging restriction is performed, the OCV corresponding to the usable lower limit SOC is set as the termination voltage X, and when the discharging restriction is performed, the OCV corresponding to the usable upper limit SOC is set as the termination voltage X. FIG. 3(f) shows a change in the SOC when the charging restriction is performed. It is determined that the terminal voltage of the secondary battery 10 has reached the termination voltage X when the SOC reaches the usable lower limit SOC at t6.

In step S10 shown in FIG. 2, if it is determined that the terminal voltage of the secondary battery 10 has not reached the termination voltage X, the process returns to step S10 again. In step S10, if it is determined that the terminal voltage of the secondary battery 10 has reached the termination voltage X, in step S11, charging and discharging of the secondary battery 10 are both prohibited. That is, as shown in FIG. 3(b), at t6, charging and discharging prohibition control is turned on. Thus, as shown in FIG. 3(d), the current value is no longer detected at t6.

Figure 3:
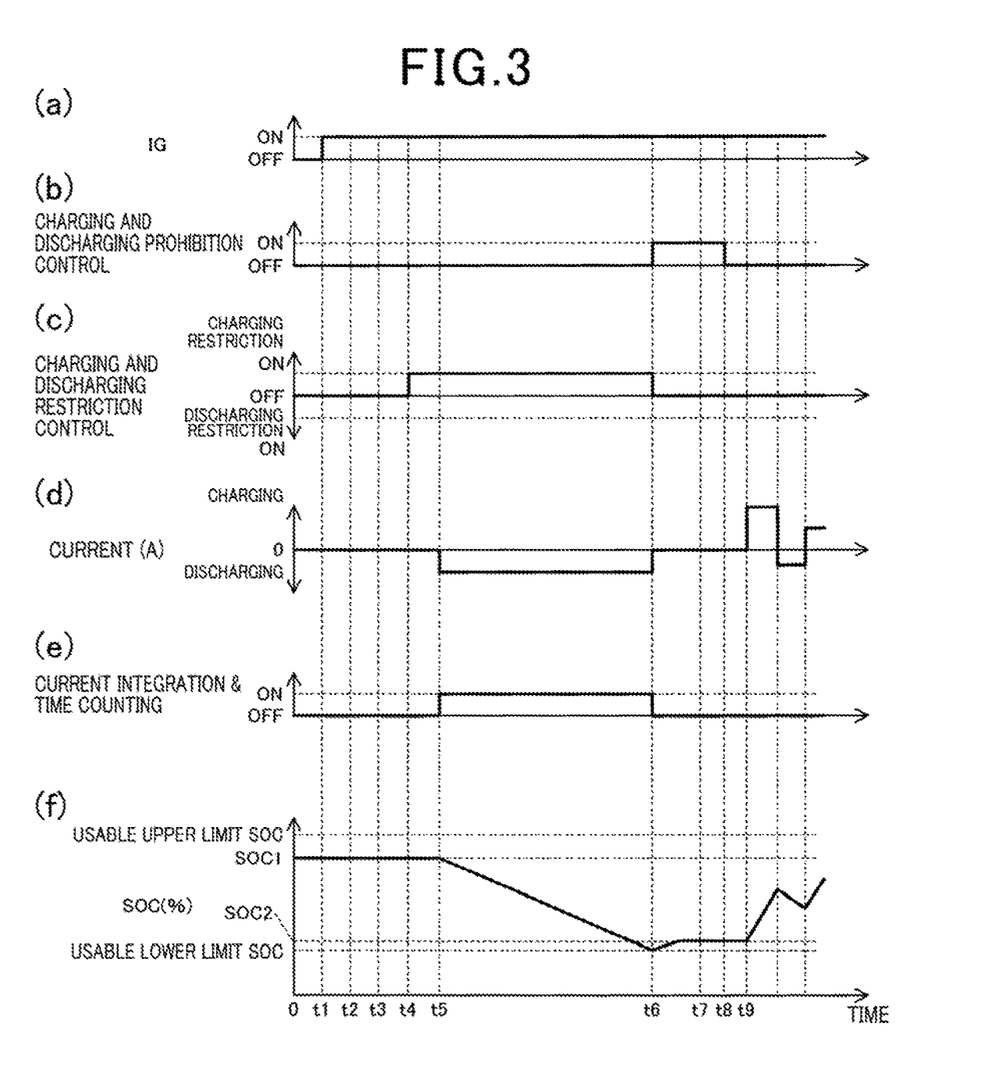
FIG. 3 is a timing chart of the battery pack according to the first embodiment.
Figure 4:
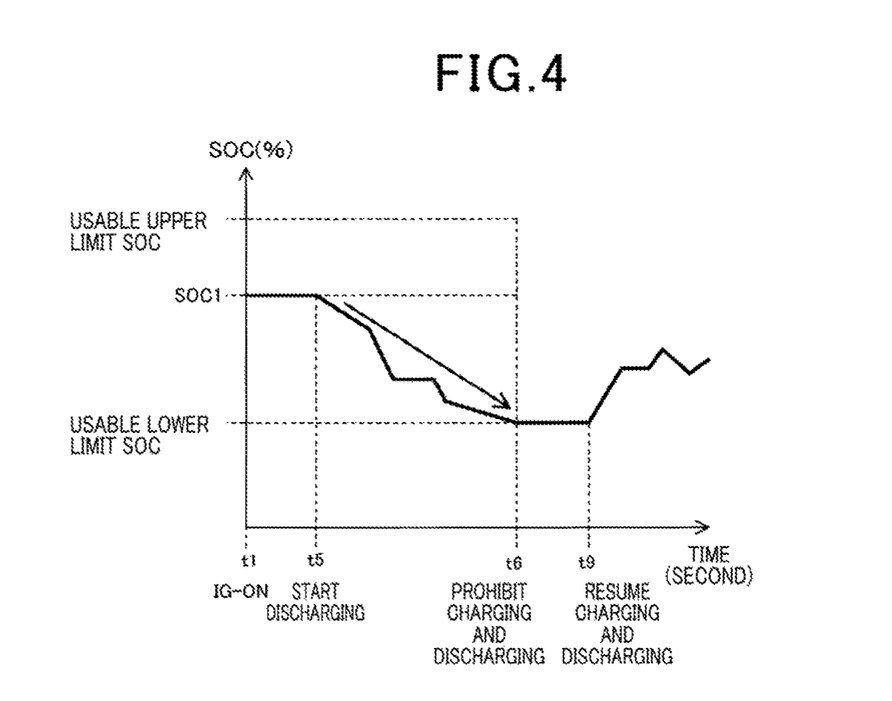
FIG. 4 is a graph showing a change in SOC in a state in which charging is restricted according to the first embodiment.

In step S12 shown in FIG. 2, the integration of the current amount and the counter 17 are terminated at t6 as shown in FIG. 3(e). Additionally, in step S13 shown in FIG. 2, the charging restriction is cancelled in the case in which the charging restriction of step S6 is performed, and the discharging restriction is cancelled in the case in which the discharging restriction of step S7 is performed, at t6 as shown in FIG. 3(c).

Subsequently, in step S14 shown in FIG. 2, it is determined whether the polarization of the secondary battery 10 has been eliminated. In the present embodiment, if five minutes or more have elapsed from when the prohibition of charging and discharging of the secondary battery 10 is started in step S11, it is determined that the polarization of the secondary battery 10 has been eliminated. In step S14, if it is determined that the polarization of the secondary battery 10 has not been eliminated, the process returns to step S14 again. In step S14, if it is determined that the polarization of the secondary battery 10 has been eliminated, in step S15 shown in FIG. 2, the voltage detector 11 detects the second terminal voltage OCV2, which is the terminal voltage of the secondary battery 10. That is, in FIGS. 3(a) to 3(f), t7 is referred to as the second detection timing t7. In step S16 shown in FIG. 2, the prohibition of charging and discharging is cancelled. That is, as shown in FIG. 3(b), the prohibition control of charging and discharging is turned off at t8.

In step S17 shown in FIG. 2, the state of charge calculator 13 acquires the second state of charge SOC2 based on the OCV2. Furthermore, in step S18, the difference $\Delta$SOC between the SOC1 and the SOC2 is calculated. The acquisition of the SOC2 and the calculation of $\Delta$SOC only need to be performed at or after t7 in FIG. 3(f).

Subsequently, in step S19 shown in FIG. 2, it is determined whether any of three determination items is applicable. The three determination items include a case in which the integrated time calculated by the integrated time calculator 18 is more than or equal to a predetermined value C, a case in which an abnormality exists in the voltage detector 11, and a case in which an abnormality exists in the current detector 12. In step S19, if it is determined that any of the above-described determination items is applicable, the control is terminated. The method for determining whether an abnormality exists in the voltage detector 11 and the current detector 12 is not limited to a particular method. However, for example, the determination section 5 may compare the detection values obtained by the voltage detector 11 and the current detector 12 with predetermined normal value ranges. If each detection value is within the associated normal value range, it is determined that no abnormality exists, and if each detection value is not within the associated normal value range, it is determined that an abnormality exists.

If it is determined in step S19 that none of the above-described determination items is applicable, the full charge capacity calculator 16 calculates the full charge capacity in step S20, and the control for calculating the full charge capacity is terminated. Subsequently, in step S21, charging and discharging of the secondary battery 10 are started in normal control from t9 shown in FIG. 3.

Next, advantages of the battery pack 1 according to the present embodiment will be described in detail.

In the battery pack 1, during the subject period t5 to t6 during which the integrated current amount is calculated, only one of charging and discharging of the secondary battery 10 is permitted. This shortens the time period of charging and discharging required for acquiring a predetermined $\Delta$SOC. Thus, offset errors of the current sensor accumulated in the integrated current amount $\int Idt$ can be reduced. As a result, the full charge capacity of the secondary battery 10 can be accurately calculated from the relational expression of $\Delta$SOC and the integrated current amount $\int Idt$.

In the present embodiment, the timing at which the differential state of charge $\Delta$SOC is more than or equal to the required $\Delta$SOC is set as the second detection timing t7. At the second detection timing t7, the second terminal voltage is detected, and the charging-and-discharging control section 20 is configured to determine which one of charging and discharging to restrict based on the first state of charge SOC1 and the required $\Delta$SOC. Thus, since $\Delta$SOC can be reliably set to be more than or equal to the required $\Delta$SOC, the value of $\Delta$SOC can be increased. As a result, compared with a case in which $\Delta$SOC is small, an error caused when the full charge capacity is calculated can be reduced.

In the present embodiment, the charging-and-discharging control section 20 is configured so that, if the absolute value of the difference between the first state of charge SOC1 and the state of charge at the lower limit with which the use of the secondary battery 10 is permitted, that is, the usable lower limit SOC is more than or equal to the required $\Delta$SOC, the charging of the secondary battery 10 is restricted. Thus, when the first state of charge SOC1 is relatively large, SOC that is more than or equal to the required $\Delta$SOC can be acquired in a short time. This reduces an error caused when the full charge capacity is calculated.

In the present embodiment, the charging-and-discharging control section 20 is configured so that, if the absolute value of the difference between the first state of charge SOC1 and the state of charge at the upper limit with which the use of the secondary battery 10 is permitted, that is, the usable upper limit SOC is more than or equal to the required $\Delta$SOC, discharging of the secondary battery 10 is restricted. Thus, when the first state of charge SOC1 is relatively small, $\Delta$SOC that is more than or equal to the required $\Delta$SOC can be acquired in a short time. This reduces an error caused when the full charge capacity is calculated.

In the present embodiment, at at least one of the first detection timing t2 and the second detection timing t7, the secondary battery 10 has no load and the polarization of the secondary battery 10 has been eliminated. Thus, the detection error of the terminal voltage caused due to the polarization of the secondary battery 10 can be reduced. This reduces an error caused when the full charge capacity is calculated. In particular, in the present embodiment, at both the first detection timing t2 and the second detection timing t7, there is no load, and the polarization of the secondary battery 10 has been eliminated. This further reduces an error caused when the full charge capacity is calculated. The polarization of the secondary battery 10 does not necessarily have to be completely eliminated, but only needs to be eliminated to a degree that ensures the accuracy of the required SOC.

Furthermore, in the present embodiment, the charging-and-discharging control section 20 is configured to cause the charging restriction and the discharging restriction to be cancelled at the second detection timing t7. Thus, the normal charging-and-discharging control can be performed at an early stage, so that no time is wasted. The present embodiment mounted in the vehicle can inhibit a decrease in the fuel efficiency of the vehicle.

The present embodiment also includes the integrated time calculator 18, which calculates the integrated time during which the current detector 12 has detected the current. If at least one of the following conditions has occurred, a first condition being that the integrated time calculated by the integrated time calculator 18 is more than or equal to the predetermined value C, a second condition being that it is determined that an abnormality exists in the voltage detector 11, a third condition being that it is determined that an abnormality exists in the current detector 12, the charging-and-discharging control section 20 is configured so that the full charge capacity calculator 16 does not calculate the full charge capacity without performing the restriction. If the integrated time during which the current is detected is more than or equal to the predetermined value C, the offset errors of the current sensor accumulated in the integrated current amount ∫Idt becomes relatively large. If an abnormality exists in the voltage detector 11 or the current detector 12, the accuracy of the calculated full charge capacity becomes low. Thus, the full charge capacity is not calculated in these cases, so that the calculation accuracy of the full charge capacity can be maintained at a high level. The value of the predetermined value C is not limited to a particular value, but a value in the range of 20 to 30 minutes is set in the present embodiment.

The present embodiment configures the power supply system 100, which includes the battery pack 1, the rotary electric machine 101, which is electrically connected to the battery pack 1 and is an electric power generating section capable of generating electric power input to the battery pack 1, and the electrical load 102, which is electrically connected to the battery pack 1 and is capable of consuming electric power output from the battery pack 1. The power supply system 100 configured as described above accurately calculates the full charge capacity of the battery pack 1, so that the energy can be efficiently used in the entire power supply system 100. Furthermore, in the present embodiment, since the power supply system 100 is mounted in the vehicle, the power supply system 100 efficiently uses the energy, so that the fuel efficiency is improved.

As described above, the present embodiment provides the battery pack 1, which can accurately calculate the full charge capacity of the secondary battery 10.

In the present embodiment, in step S5 as shown in FIG. 2, if it is determined that the absolute value of the difference between the SOC1 and the usable lower limit SOC is more than or equal to the required ΔSOC, the process proceeds to step S6, and if not, the process proceeds to step S7. Instead, like a first modification and a second modification described below, the charging-and-discharging control section 20 may be configured to restrict one of charging and discharging and not to restrict the other one.

Figure 6:
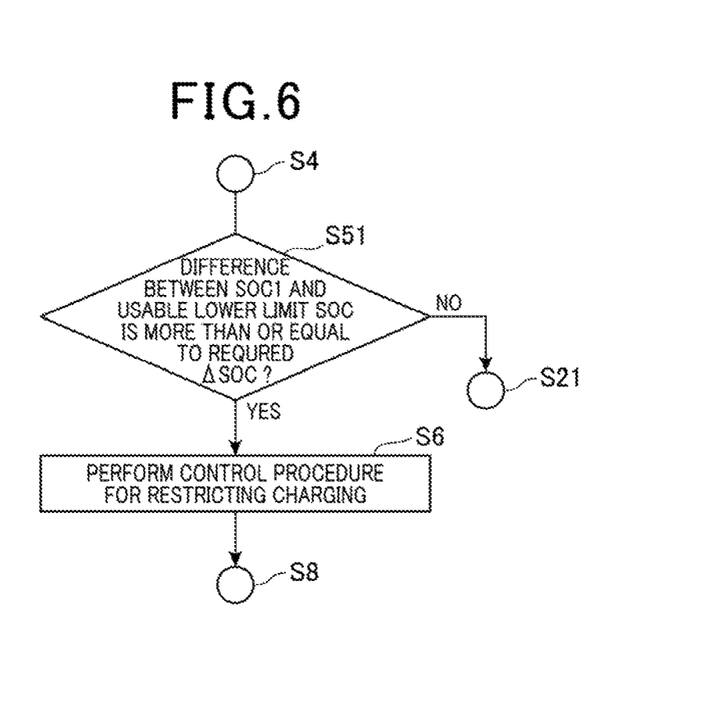
FIG. 6 is a control flowchart of a battery pack according to a first modification.

In the first modification, after executing steps S1 to S4 shown in FIG. 2 like the case of the present embodiment, instead of proceeding to step S5, the process may proceed to step S51 shown in FIG. 6. In step S51, if it is determined that the absolute value of the difference between the SOC1 and the usable lower limit SOC is more than or equal to the required ΔSOC, the process proceeds to step S6 and the following steps like the case of the present embodiment. However, if it is determined that the absolute value of the difference between the SOC1 and the usable lower limit SOC is not more than or equal to the required ΔSOC, instead of proceeding to step S7, the process proceeds to step S21 shown in FIG. 2 to start charging and discharging in the normal control, and the control for calculating the full charge capacity is terminated. Thus, in the first modification, the charging-and-discharging control section 20 restricts charging, but does not restrict discharging.

Figure 7:
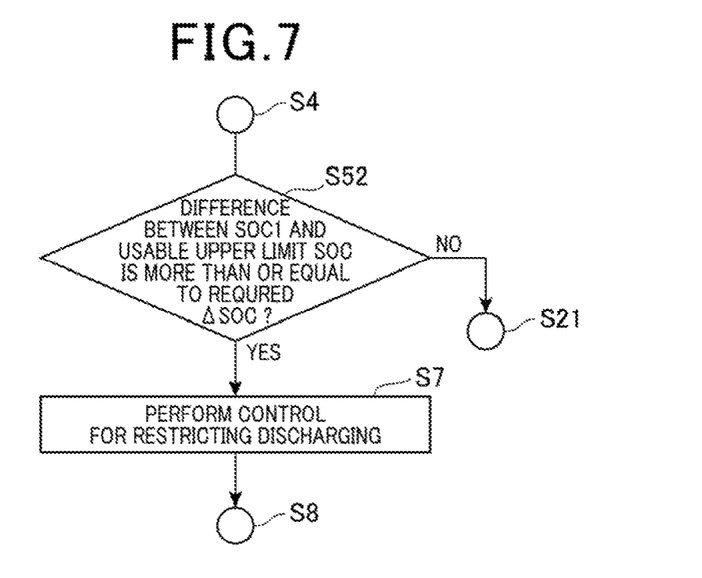
FIG. 7 is a control flowchart of a battery pack according to a second modification.

In the second modification, after executing steps S1 to S4 shown in FIG. 2 like the case of the present embodiment, instead of proceeding to step S5, the process proceeds to step S52 of FIG. 7. In step S52, if it is determined that the absolute value of the difference between the SOC1 and the usable upper limit SOC is more than or equal to the required ΔSOC, the process proceeds to step S7 and the following steps shown in FIG. 2 like the case of the present embodiment. However, if it is determined that the absolute value of the difference between the SOC1 and the usable upper limit SOC is not more than or equal to the required ΔSOC, the control is terminated. Thus, in the second modification, the charging-and-discharging control section 20 restricts discharging, but does not restrict charging.

As described above, in the first and second modifications, the charging-and-discharging control section 20 restricts only discharging or charging. Thus, compared with a case in which the charging-and-discharging control section 20 is configured to restrict both charging and discharging, the configuration of the charging-and-discharging control section 20 can be simplified, and the charging-and-discharging control is facilitated.

A third modification described below may be employed. In the third modification, after executing steps S1 to S4 shown in FIG. 2 like the case of the present embodiment, instead of proceeding to step S5, the process proceeds to step S53 shown in FIG. 8. In step S53, if it is determined that the absolute value of the difference between the SOC1 and the usable lower limit SOC is more than or equal to the required ΔSOC, the process proceeds to step S6 and the following steps like the case of the present embodiment. However, if it is determined that the absolute value of the difference between the SOC1 and the usable lower limit SOC is not more than or equal to the required ΔSOC, the process proceeds to step S54. In step S54, if it is determined that the absolute value of the difference between the SOC1 and the usable upper limit SOC is more than or equal to the required ΔSOC, the process proceeds to step S7 and the following steps shown in FIG. 2 like the case of the present embodiment. However, if it is determined that the absolute value of the difference between the SOC1 and the usable upper limit SOC is not more than or equal to the required ΔSOC, the process proceeds to step S21 shown in FIG. 2 to start charging and discharging in the normal control, and the control for calculating the full charge capacity is terminated.

Figure 8:
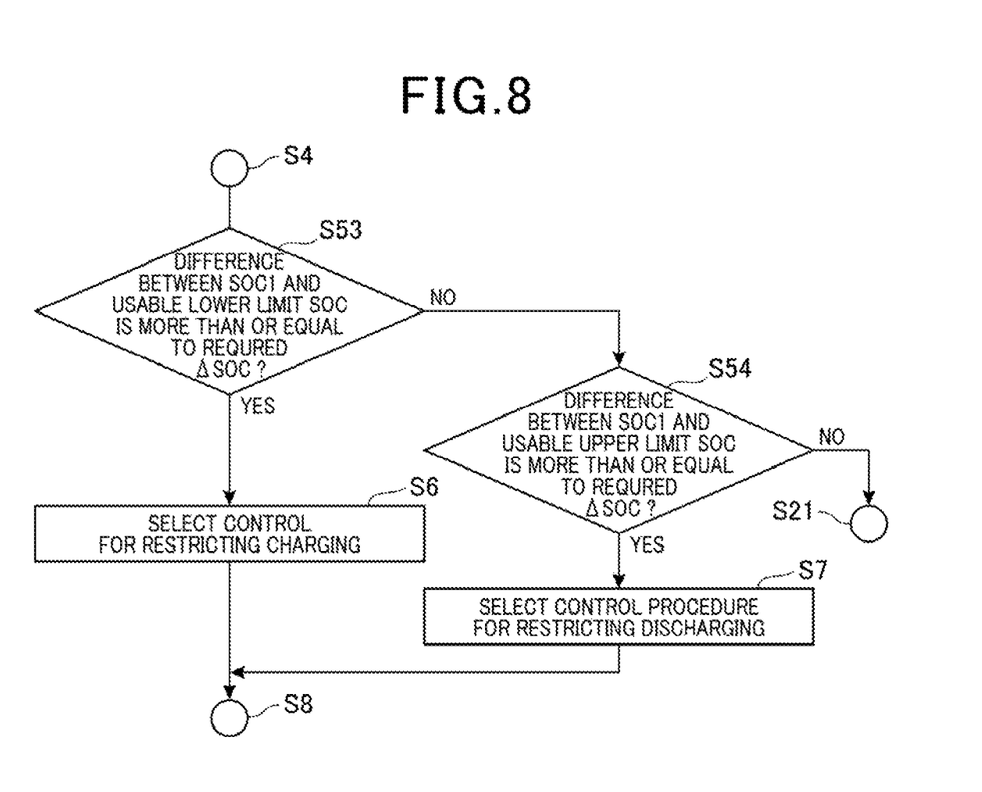
FIG. 8 is a control flowchart of a battery pack according to a third modification.

In the third modification, after step S4, step S54 may be executed. In step S54, if it is determined that the absolute value of the difference between the SOC1 and the usable upper limit SOC is not more than or equal to the required ΔSOC, the step S53 may be executed. In step S53, if it is determined that the absolute value of the difference between the SOC1 and the usable lower limit SOC is not more than or equal to the required ΔSOC, the process may proceed to step S21 shown in FIG. 2.

The control flow of the third modification is suitable for the case in which the required ΔSOC is more than a median value between the usable upper limit SOC and the usable lower limit SOC. In this case, there may possibly be a case in which the SOC1 takes a value such that both the absolute value of the difference between the SOC1 and the usable upper limit SOC and the absolute value of the difference between the SOC1 and the usable lower limit SOC are less than the required ΔSOC. In such a case, since ΔSOC cannot be made more than or equal to the required ΔSOC, the control is performed not to calculate the full charge capacity. Thus, the full charge capacity is calculated when ΔSOC is a relatively large value that is more than or equal to the required Δ SOC. With the value of ΔSOC being close to the full charge capacity, an error caused when the full charge capacity is calculated can be reduced.

Figure 9:
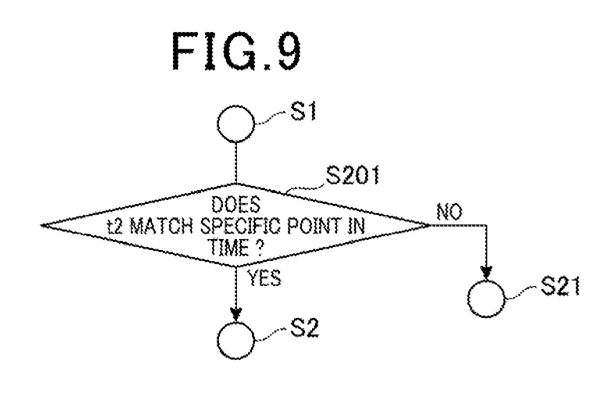
FIG. 9 is a control flowchart of a battery pack according to a fourth modification.

A fourth modification described below may be employed. In the fourth modification, after executing step S1 shown in FIG. 2 like the case of the present embodiment, instead of proceeding to step S2, the process proceeds to step S201 shown in FIG. 9. In step S201, it is determined whether the first detection timing t2 matches the specific timing. If the first detection timing t2 matches the specific timing, the process proceeds to step S2 and the following steps shown in FIG. 2. Step S2 and the following steps are executed like in the present embodiment to perform the control for calculating the full charge capacity. As shown in FIG. 9, if it is determined that the first detection timing t2 does not match the specific timing, the process proceeds to step S21 shown in FIG. 2, and normal charging and discharging are started, and the control for calculating the full charge capacity is terminated.

According to the control flow of the fourth modification, the full charge capacity is calculated if the first detection timing t2 matches the specific timing and is not calculated in other cases. As a result, occasions in which the full charge capacity is calculated are prevented from being increased more than necessary, so that the energy can be efficiently used.

The setting of the specific timing can be appropriately adjusted in accordance with the requested frequency of calculating the full charge capacity. For example, in the battery pack 1 mounted in the vehicle like in the present embodiment, the state in which the number of the trip periods that occurs from when the IG is turned on to when the IG is turned off has reached a predetermined number may be set as the specific timing. In this case, the full charge capacity is calculated when the specific trip, which corresponds to the specific timing, occurs, and the full charge capacity is not calculated in other trips. This prevents the full charge capacity from being calculated more than necessary, so that an unnecessary decrease in the fuel efficiency can be prevented.

The present disclosure is not limited to the above-described embodiment and the modifications and is applicable to various embodiments and modifications without departing from the spirit of the present disclosure.

Although the present disclosure has been described in accordance with the embodiment, it is understood that the present disclosure is not limited to the embodiment and the structures thereof. The present disclosure embraces various modified forms and modifications within the range of equivalence. Additionally, various combinations and forms, as well as other combinations and forms further including only one or more or less elements are also within the scope and spirit of the present disclosure.

Hereinafter, aspects of the above-described embodiment will be summarized.

A first aspect of the present disclosure includes a battery pack (1), which includes a secondary battery (10), a voltage detector (11), a state of charge calculator (13), a current detector (12), a charging-and-discharging control section (20), a differential state of charge calculator (15), an integrated current amount calculator (14), and a full charge capacity calculator (16). The voltage detector detects a terminal voltage of the secondary battery. The state of charge calculator calculates a state of charge (SOC) of the secondary battery based on the terminal voltage detected by the voltage detector. The current detector detects a current flowing to the secondary battery. The charging-and-discharging control section controls charging and discharging of the secondary battery. The differential state of charge calculator calculates a differential state of charge ($\Delta$SOC) between a first state of charge (SOC1) calculated based on a first terminal voltage (OCV1) detected by the voltage detector at a first detection timing (t2) and a second state of charge (SOC2) calculated based on a second terminal voltage (OCV2) detected by the voltage detector at a second detection timing (t7). The integrated current amount calculator calculates an integrated amount ($\int Idt$) of a current detected by the current detector in a subject period from the first detection timing to the second detection timing. The full charge capacity calculator calculates a full charge capacity of the secondary battery based on the differential state of charge calculated by the differential state of charge calculator and the integrated current amount calculated by the integrated current amount calculator. The charging-and-discharging control section is configured to restrict one of the charging and the discharging of the secondary battery during the subject period.

In the above-described battery pack, during the subject period in which the integrated current amount is calculated, one of the charging and the discharging of the secondary battery is restricted. This shortens the charging and discharging time required for acquiring a predetermined differential state of charge $\Delta$SOC, so that the offset errors of the current sensor that are accumulated in the integrated current amount $\int Idt$ are reduced. As a result, the full charge capacity of the secondary battery can be accurately calculated from the relational expression of $\Delta$SOC and $\int Idt$.

As described above, the present disclosure can provide a battery pack that includes a secondary battery and can accurately calculate the full charge capacity of the secondary battery.

Reference signs in parentheses in the claims indicate the correspondence relations to specific means in the embodiment described above and do not limit the technical scope of the present disclosure.

What is claimed is:

1. A battery pack comprising:
   a secondary battery;
   a voltage detector that detects a terminal voltage of the secondary battery;
   a state of charge calculator that calculates a state of charge of the secondary battery based on the terminal voltage detected by the voltage detector;
   a current detector that detects a current flowing to the secondary battery;
   a differential state of charge calculator that calculates a differential state of charge between a first state of charge calculated based on a first terminal voltage detected by the voltage detector at a first detection timing and a second state of charge calculated based on a second terminal voltage detected by the voltage detector at a second detection timing, the second detection timing being when the differential state of charge becomes more than or equal to a required differential state of charge;
   an integrated current amount calculator that calculates an integrated amount of the current detected by the current detector in a subject period from the first detection timing to the second detection timing;
   a full charge capacity calculator that calculates a full charge capacity of the secondary battery based on the differential state of charge calculated by the differential state of charge calculator and the integrated current amount calculated by the integrated current amount calculator; and a charging-and-discharging control section that controls charging and discharging of the secondary battery, the charging-and-discharging control section is being configured to:
   determine which one of the charging and the discharging to restrict based on the first state of charge and the required differential state of charge; and
   restrict the determined one of charging and discharging of the secondary battery only during the subject period.

2. The battery pack according to claim 1, wherein if an absolute value of a difference between the first state of charge and a state of charge at a lower limit with which use of the secondary battery is permitted is more than or equal to the required differential state of charge, the charging-and-discharging control section is configured to restrict the charging of the secondary battery.

3. The battery pack according to claim 1, wherein if an absolute value of a difference between the first state of charge and a state of charge at an upper limit with which use of the secondary battery is permitted is more than or equal to the required differential state of charge, the charging-and-discharging control section is configured to restrict the discharging of the secondary battery.

4. The battery pack according to claim 1, wherein during at least one of the first detection timing and the second detection timing, the secondary battery is configured to have no load, and so that polarization of the secondary battery is eliminated.

5. The battery pack according to claim 1, wherein the charging-and-discharging control section is configured to have a restriction cancelled at the second detection timing.

6. The battery pack according to claim 1, further comprising:
   an integrated time calculator that calculates an integrated time during which the current detector has detected the current,
   wherein if at least one of a case in which the integrated time calculated by the integrated time calculator is more than or equal to a predetermined value, a case in which it is determined that an abnormality exists in the voltage detector, and a case in which it is determined that an abnormality exists in the current detector is applicable, the charging-and-discharging control section is configured so that the full charge calculator does not calculate the full charge capacity.

7. The battery pack according to claim 1, wherein,
   if the first detection timing matches a specific timing, the charging-and-discharging control section performs a restriction, and the full charge calculator calculates the full charge capacity, and
   if the first detection timing does not match the specific timing, the charging-and-discharging control section is configured not to perform the restriction and the full charge calculator is configured not to calculate the full charge capacity.

8. A power supply system comprising the battery pack according to claim 1, an electric power generating section that is electrically connected to the battery pack and is capable of generating electric power input to the battery pack, and an electrical load that is electrically connected to the battery pack and is capable of consuming electric power output from the battery pack.

* * * * *